United States Patent
Taniguchi et al.

(10) Patent No.: US 12,046,309 B2
(45) Date of Patent: Jul. 23, 2024

(54) ELEMENT SUBSTRATE

(71) Applicant: CANON KABUSHIKI KAISHA, Tokyo (JP)

(72) Inventors: Suguru Taniguchi, Kanagawa (JP); Toshio Negishi, Kanagawa (JP); Yasuhiro Soeda, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 224 days.

(21) Appl. No.: 17/691,291

(22) Filed: Mar. 10, 2022

(65) Prior Publication Data

US 2022/0293199 A1    Sep. 15, 2022

(30) Foreign Application Priority Data

Mar. 12, 2021  (JP) .................. 2021-040698

(51) Int. Cl.
| | |
|---|---|
| *G11C 17/16* | (2006.01) |
| *B41J 2/045* | (2006.01) |
| *B41J 2/175* | (2006.01) |

(52) U.S. Cl.
CPC ........... *G11C 17/16* (2013.01); *B41J 2/04541* (2013.01); *B41J 2/04543* (2013.01); *B41J 2/0458* (2013.01); *B41J 2202/17* (2013.01)

(58) Field of Classification Search
CPC ..... B41J 2/14; B41J 2/175; B41J 2/045; B41J 2/05; H01L 23/525; H01L 23/528; H02H 9/04; G11C 17/16; G06K 15/02; G06K 15/12; G06F 15/00
See application file for complete search history.

(56) References Cited

U.S. PATENT DOCUMENTS

| | | | | |
|---|---|---|---|---|
| 5,200,763 | A * | 4/1993 | Tanuma | B41J 2/45 347/237 |
| 7,075,674 | B2 * | 7/2006 | Nagumo | G06K 15/1247 358/1.9 |
| 7,309,120 | B2 | 12/2007 | Hatsui et al. | |
| 10,201,969 | B2 | 2/2019 | Negishi et al. | |
| 2001/0045967 | A1 * | 11/2001 | Hayasaki | B41J 2/04543 347/9 |
| 2004/0217998 | A1 * | 11/2004 | Hayasaki | B41J 2/04543 347/12 |
| 2007/0091131 | A1 | 4/2007 | Hatsui et al. | |
| 2008/0253203 | A1 * | 10/2008 | Bae | G11C 7/1051 365/219 |

(Continued)

FOREIGN PATENT DOCUMENTS

| | | |
|---|---|---|
| JP | 2006-15736 A | 1/2006 |
| JP | 2018-134809 A | 8/2018 |

OTHER PUBLICATIONS

U.S. Appl. No. 17/691,281, filed Mar. 10, 2022 (avalaible on USPTO system).

*Primary Examiner* — John Zimmermann
(74) *Attorney, Agent, or Firm* — VENABLE LLP

(57) ABSTRACT

A switch is configured to switch connection between a second terminal to which a data signal is input and a memory control signal of a memory element in accordance with a switching signal included in a data signal. In write to a memory element, the switching signal switches such that the switch connects the second terminal and the memory control signal of the memory element, and a pulse signal for the write to the memory element is input via the second terminal.

2 Claims, 12 Drawing Sheets

(56) References Cited

U.S. PATENT DOCUMENTS

| | | | |
|---|---|---|---|
| 2014/0078223 A1* | 3/2014 | Ohmura | G11C 17/16 |
| | | | 347/56 |
| 2018/0029357 A1* | 2/2018 | Kasai | B41J 2/0458 |
| 2018/0236761 A1* | 8/2018 | Taniguchi | B41J 2/0458 |
| 2018/0236762 A1 | 8/2018 | Negishi et al. | |

* cited by examiner

ELEMENT SUBSTRATE

BACKGROUND OF THE INVENTION

Field of the Invention

The present invention relates to an element substrate.

Description of the Related Art

A Poly fuse memory is known as an OTP (One Time Programmable) ROM configured to record specific information such as a product ID and setting parameters in a head on a print element substrate mounted on a conventional liquid discharge head. The Poly fuse memory uses polysilicon for forming the gate wirings of transistors, resistive elements, and the like, and is advantageous because the memory can be formed on a print element substrate without adding a new step to an existing semiconductor manufacturing process. As a conventional technique using a write circuit that performs write to a Poly fuse memory, for example, Japanese Patent Laid-Open No. 2006-15736 exists.

Recently, as a memory that can make a memory module small as compared to the Poly fuse memory and can be produced using a conventional semiconductor manufacturing process without adding a new step, an anti-fuse memory described in Japanese Patent Laid-Open No. 2006-15736 exists. The gate oxide film of a MOS transistor is formed as a memory, an overvoltage is applied to the gate oxide film to cause a short circuit, and the characteristic change is used as a memory.

In Japanese Patent Laid-Open No. 2006-15736, in the write operation of the Poly fuse memory, a serial data signal is input to a shift register in synchronism with a clock signal and then held in a latch circuit in accordance with a latch signal. This latch signal is used as a control signal for the write operation. Originally, the latch signal is a signal for causing the latch circuit to hold the data of the shift register. Hence, the latch signal is not input at a high frequency in general.

SUMMARY OF THE INVENTION

The present invention provides a technique capable of preventing an operation error of a circuit and reliably writing data to a memory element in a short time without adding a terminal configured to input a signal dedicated to write to the memory element.

The present invention in one aspect provides an element substrate comprising: a plurality of groups of print elements; a plurality of groups of memory elements; a first terminal to which a clock signal is input; a second terminal to which a data signal is input; a control data supply unit configured to receive the data signal input from the second terminal in synchronism with the clock signal input from the first terminal and output a selection signal used to select groups and blocks of the memory elements and the print elements; and a switch configured to switch connection between the second terminal and a memory control signal of the memory element in accordance with a switching signal included in the data signal, wherein in write to the memory element, the switching signal switches such that the switch connects the second terminal and the memory control signal of the memory element, and a pulse signal for the write to the memory element is input via the second terminal.

According to the present invention, it is possible to prevent an operation error of a circuit and reliably write data to a memory element in a short time without adding a terminal configured to input a signal dedicated to write to the memory element.

Further features of the present invention will become apparent from the following description of exemplary embodiments with reference to the attached drawings.

DESCRIPTION OF THE EMBODIMENTS

Figure 1:
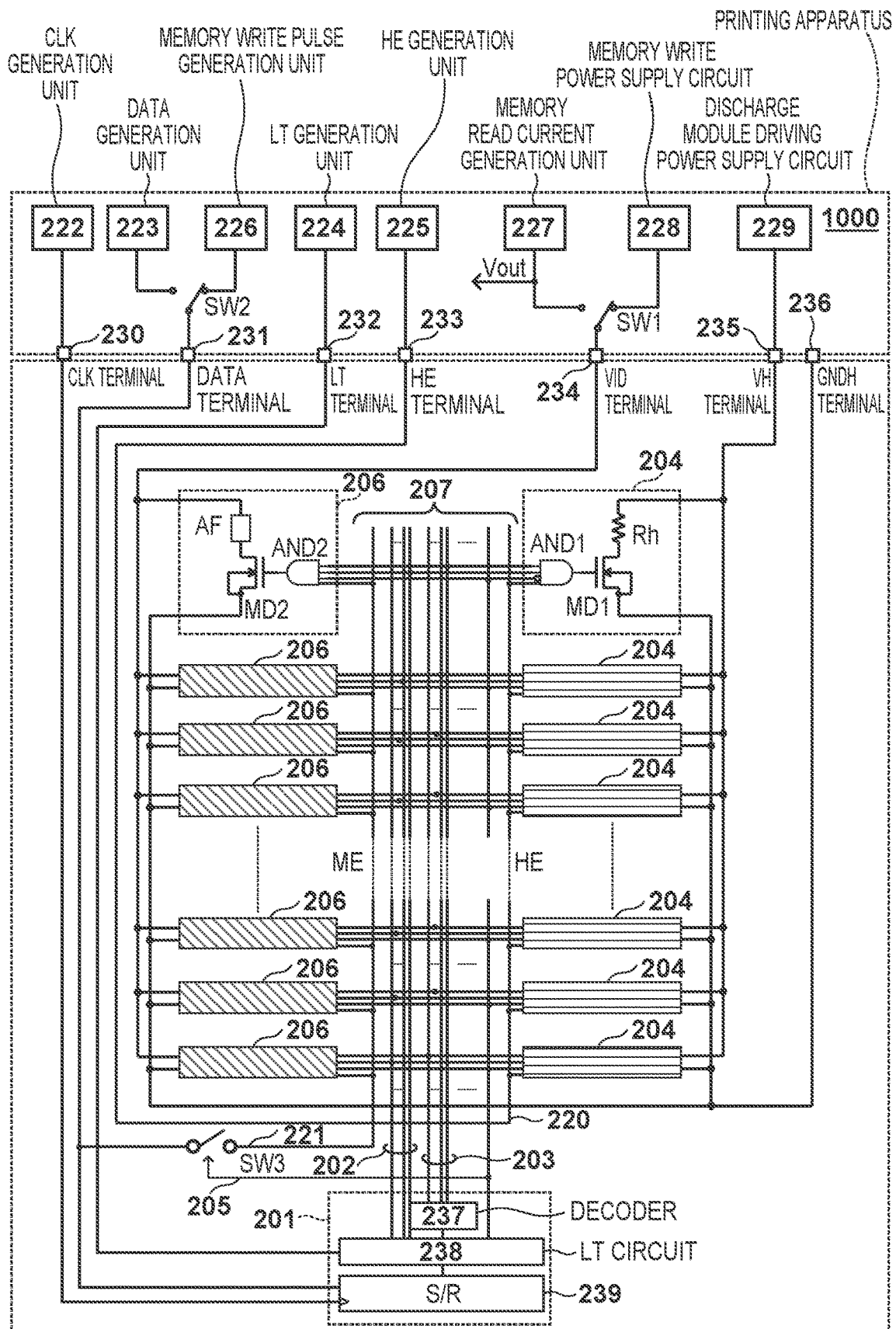
FIG. 1 is a view showing discharge modules, memory modules, and a part of a driving circuit configuration mounted on an element substrate 11 according to the first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

Since a Poly fuse memory employs a principle of performing write by disconnecting a resistive body, the write can be performed by applying a DC voltage only once for a predetermined time. Hence, no problem is posed even if a latch signal is used as a control signal for the write operation.

On the other hand, an anti-fuse memory uses a principle of performing write by breaking a gate oxide film. For this reason, write is not performed using a DC voltage, and a pulse waveform for intermittently applying a voltage needs to be applied a plurality of times. Hence, to perform write in a shorter time, a high-frequency pulse waveform needs to be applied. Hence, if a latch signal is used as a control signal in writing to the anti-fuse memory, a latch circuit is activated at a high frequency. This may cause an operation error in the above-described latch circuit or the like, and wrong data may be held. To prevent this, a control signal dedicated to write to the anti-fuse memory may be provided. However, since a terminal for the signal is added, the number of terminals increases, resulting in an increase in the size of a print element substrate.

According to the following embodiment, it is possible to prevent an operation error of a circuit and reliably write data to a memory element in a short time without adding a terminal configured to input a signal dedicated to write to the memory element.

Note that in the following description of the embodiment, "print" includes not only formation of significant information such as a character or graphic pattern but also formation of an image, design, or pattern on print media in a broader sense and processing of print media, regardless of whether the information is significant or insignificant, regardless of whether the information has become obvious to allow human visual perception. Also, in this embodiment, "print medium" is assumed to be sheet-shaped paper but may be a fabric, a plastic film, or the like.

Figure 2A:
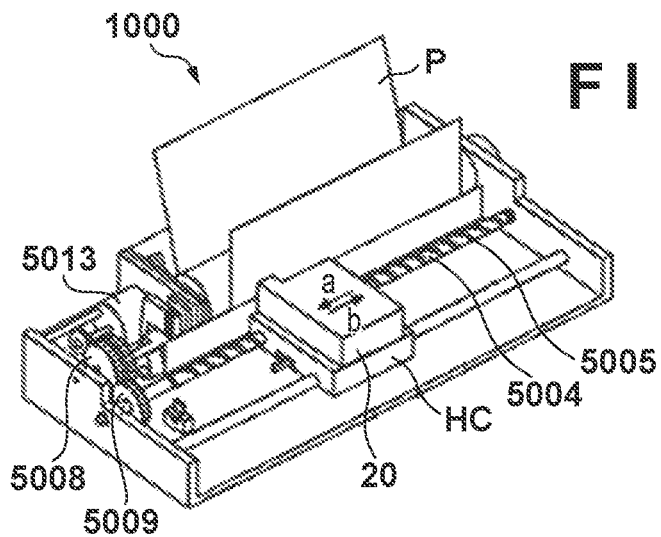
FIGS. 2A to 2D are views for explaining a printing apparatus capable of including a printhead unit according to the embodiment, the printhead unit, a printhead, and a memory module circuit configuration.

FIG. 2A is a schematic perspective view showing a printing apparatus 1000 capable of including a printhead unit 20 according to an embodiment of the present invention.

As shown in FIG. 2A, interlocking with forward and reverse rotation of a driving motor 5013, a lead screw 5004 rotates via driving force transmission gears 5008 and 5009. The printhead unit 20 can be placed on a carriage HC. The carriage HC includes a pin (not shown) configured to engage with a helical groove 5005 of the lead screw 5004, and reciprocally moves in the directions of arrows a and b as the lead screw 5004 rotates.

Figure 2B:
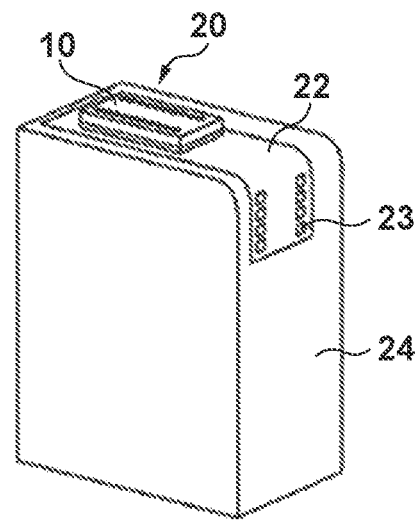

FIG. 2B is a perspective view showing an example of the printhead unit 20 including a printhead 10 according to the embodiment.

The printhead unit 20 includes the printhead 10, and a storage unit 24 that stores a printing material (ink) to be supplied to the printhead 10, and constitutes a cartridge by integrating these. The printhead 10 is provided on a surface facing a print medium P shown in FIG. 2A. Note that these need not always be integrated, and a form that allows the storage unit 24 to be detached can also be employed. In addition, the printhead unit 20 includes a tape member 22. The tape member 22 includes a terminal configured to supply power to the printhead 10, and transmits/receives power and various kinds of signals to/from the printing apparatus main body via contacts 23.

Figure 2C:
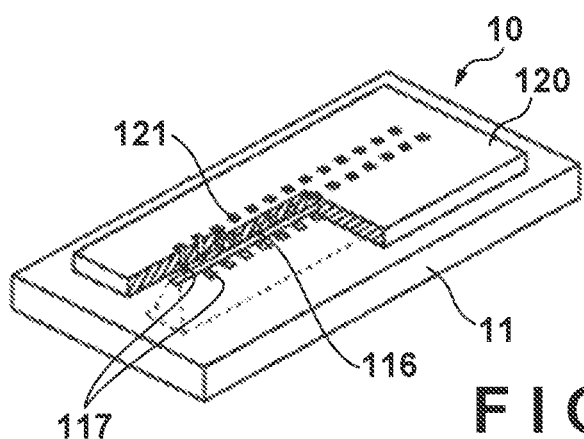

FIG. 2C is a schematic perspective view of the printhead 10 according to the embodiment.

The printhead 10 serving as a liquid discharge head includes a print element substrate 11 and a channel forming member 120. The print element substrate 11 is provided with a plurality of arrays of heat action units 117 configured to apply thermal energy generated by electrothermal transducers to the printing material. The channel forming member 120 also serves as an orifice member in which a plurality of arrays of orifices 121 configured to discharge the printing material are provided in correspondence with the heat action units 117. Power and signals are sent from the printing apparatus main body to the print element substrate 11 via the tape member 22, thermal energy generated by driving the electrothermal transducers is applied to the printing material (liquid; ink) via the heat action units 117, and the printing material is discharged from the orifices 121.

First Embodiment

The circuit configurations of a discharge module 204 and a memory module 206 mounted on a print element substrate (to be also simply referred to as a "substrate" hereinafter) as a semiconductor substrate according to the first embodiment of the present invention will be described next with reference to FIGS. 1 to 3.

FIG. 1 is a view showing a part of the circuit configuration of a print element substrate 11 according to the first embodiment of the present invention. Note that the print element substrate 11 is used as the above-described print element substrate 11 shown in FIG. 2.

The substrate 11 includes a plurality of groups of discharge modules 204 and a plurality of groups of memory modules 206. The discharge module 204 includes a print element Rh (for example, an electrothermal transducer), a driving element (transistor) MD1 configured to drive the print element Rh, and an AND circuit AND1 for print element selection. When the print element Rh is driven, a printing material such as ink is discharged from an orifice 121, thereby performing printing.

Also, the memory module 206 includes an anti-fuse element AF serving as a memory element, a driving element (transistor) MD2 configured to write information to the anti-fuse element AF, and an AND circuit AND2 for memory element selection. When an overvoltage is supplied, the anti-fuse element AF stationarily holds information. That is, the anti-fuse element AF functions as a memory that can be programmed only once.

Based on logic data signals output from a control data supply circuit 201 that is a signal supply circuit, driving of the print element Rh or the anti-fuse element AF is controlled. The control data supply circuit 201 includes a shift register (S/R) 239, a latch (LT) circuit 238, a decoder 237, and the like. Logic data signals such as a clock signal CLK, a data signal DATA, and a latch signal LT are input to the control data supply circuit 201 via the main body of a printing apparatus 1000 or a host PC (not shown). In addition, a first power supply voltage VDD (for example, 3 to 5 V) is supplied as a logic power supply voltage to the AND circuit AND1, the AND circuit AND2, and the control data supply circuit 201. Here, when selecting a print element and a memory element, the DATA signal includes serial data used to select the discharge module 204 or the memory module 206 to be described later, and a specific bit of the data (for example, the first bit of the serial data) serves as a switching signal 205 to be described later.

Here, the control data supply circuit 201 can perform time division driving for controlling the operation of each discharge module 204 and driving the print element Rh in each of, for example, m groups each including n discharge modules 204. The control data supply circuit 201 outputs an m-bit group selection signal 202 and an n-bit block selection signal 203. Furthermore, the control data supply circuit 201 outputs at least 1 bit of switching signal 205 for switching between the print element and the memory element. Each discharge module 204 receives at least 1 bit of the group selection signal 202, at least 1 bit of the block selection signal 203, at least 1 bit of the switching signal 205, and a print element control signal HE (Heat Enable) 220, thereby time-divisionally driving the print elements Rh.

In addition, the control data supply circuit 201 can perform time division driving for controlling the operation of each memory module 206 and driving the anti-fuse element AF in each of, for example, y groups each including x memory modules 206. Each memory module 206 receives at least 1 bit of each of the group selection signal 202, the block selection signal 203, and the switching signal 205 output from the control data supply circuit 201, and a memory control (ME) signal, thereby time-divisionally driving the anti-fuse elements AF. Here, connection of a memory control signal 221 is controlled by a (switch) SW3 controlled by the switching signal 205.

That is, at the time of write to the memory module 206, the switch SW3 is turned on, and a signal generated by a memory write pulse generation unit 226 and input to a DATA terminal 231 is input as the memory control signal 221. On the other hand, at the time of driving of the discharge module 204, the switch SW3 is turned off by the switching signal 205, and the memory control signal 221 is not input to the memory module 206. This operation will be described later in detail. In addition, the memory module 206 including the anti-fuse element AF to which information should be written is decided by the group selection signal 202, the block selection signal 203, and the switching signal 205 according to the signals CLK, DATA, LT, and HE.

Note that the discharge modules 204 and the memory modules 206 are exclusively driven by the switching signal 205 and are configured such that all the print elements Rh and all the anti-fuse elements AF are not driven at the same time. That is, the switching signal 205 is a signal used to switch driving to drive one of the print element Rh and the anti-fuse element AF.

The corresponding group selection signal 202, block selection signal 203, switching signal 205, and print element control signal 220 are input to the AND circuit AND1 for print element selection. The driving element MD1 is set in a conductive state (ON state) in response to the input signals, and the print element Rh connected in series with the driving element MD1 for print element is driven.

Here, as the driving element MD1 for print element, for example, a DMOS transistor (Double-diffused MOSFET) that is a high breakdown voltage transistor is used. If the anti-fuse element AF is used as a memory element, generally, the driving current of the memory element is smaller than the driving current of the print element and the current driving capability of the DMOS transistor can also be small. Hence, the area of the driving element MD2 for memory element may be smaller than the area of the driving element MD1 for print element. In addition, as the AND circuit AND1 for print element selection, for example, a MOS transistor is used. Here, a power supply voltage (VH, for example, 24 V) for discharge module driving is supplied from the VH terminal to the discharge module 204, and the ground potential is defined as GNDH.

The corresponding group selection signal 202, block selection signal 203, switching signal 205, and memory control signal 221 are input to the AND circuit AND2 for memory element selection. A signal according to the input signals is output to the driving element MD2 for memory element, and the conductive state/non-conductive state of the driving element MD2 is switched. As the driving element MD2, for example, a DMOS transistor is used, like the driving element MD1 for print element. Also, as the AND circuit AND2 for memory element selection, a MOS transistor is used. Here, a memory write power supply voltage (for example, 24 V) used to write information to the anti-fuse element AF is supplied from a VID terminal to the memory module 206, and the ground potential is defined as GNDH. As shown in FIG. 1, the driving element MD1 for print element and the driving element MD2 for memory element may be configured to be connected to the common GNDH terminal via a common ground wiring.

Note that an example in which a memory write power supply circuit 228 and a discharge module driving power supply circuit 229 are independent power supply lines is shown. However, if the minimum value of a voltage necessary for write to the anti-fuse element AF is equal to or less than a discharge module driving voltage, the discharge module driving power supply may be used in addition to, for example, a voltage step-down circuit.

Figure 2D:
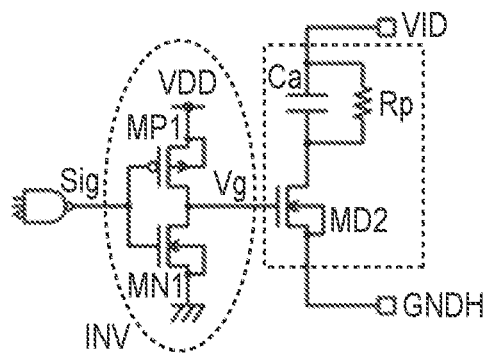

FIG. 2D is s view showing an example of the circuit configuration of the memory module 206 used in the substrate 11.

Here, the AND circuit AND2 for memory element selection is represented by a NAND circuit and an inverter INV. The inverter INV is formed by a PMOS transistor MP1 and an NMOS transistor MN1, and MOSFETs are used as the transistors MP1 and MN1. An input signal Sig is input to the inverter INV, and an output signal Vg is output to the gate of the driving element MD2 for memory element. Note that FIG. 2D shows the driving element MD2 and the AND circuit AND2, which are arranged on opposite sides from FIG. 1.

Before write of information, the anti-fuse element AF functions as, for example, a capacitance element Ca. FIG. 2D shows a state before information is written to the anti-fuse element AF, and the anti-fuse element AF is represented as the capacitance Ca. One terminal of the capacitance Ca serving as the anti-fuse element AF is connected in series with the driving element MD2. In addition, a memory write voltage VID is supplied to the other terminal of the capacitance Ca when writing/reading information.

The memory module 206 also includes a resistive element (having a resistance value Rp, and also simply referred to as a "resistive element Rp") connected in parallel with the anti-fuse element AF. This can prevent a situation that an overvoltage is applied across the anti-fuse element AF, and information is erroneously written to the anti-fuse element AF, although the driving element MD2 is in a non-conductive state.

The operation of the memory module 206 when writing information to the anti-fuse element AF will be described next. When writing information to the anti-fuse element AF, a low-level signal is input as the control signal Sig, thereby setting the driving element MD2 in the ON state. Hence, the memory write voltage VID is applied to a gate oxide film that forms the anti-fuse element AF, and the gate oxide film is broken, thereby writing information to the anti-fuse element AF. That is, the anti-fuse element AF is the capacitance element Ca before write of information, and changes to a resistive element after write.

The operation of the memory module 206 when reading information from the anti-fuse element AF will be described next.

When reading information from the anti-fuse element AF, a low-level signal is input as the control signal Sig, thereby setting the driving element MD2 for memory element in the ON state. The resistance between VID and GNDH at this time is measured, thereby discriminating whether information is written to the anti-fuse element AF.

When reading information of the anti-fuse element AF in the substrate shown in FIG. 1, after a selected memory module is driven, as in the write, the side of a memory read current generation unit 227 is selected by a switch SW1. After that, a voltage Vout in supplying a measurement constant current is measured, and the resistance between VID and GNDH is measured, thereby discriminating whether information is written to the memory module 206.

Information to be written to the anti-fuse element AF is information specific to a product, for example, a chip ID or a setting parameter. These are written using an inspection machine or the like in a factory at the time of product shipment. Alternatively, if the memory is mounted in a product main body, and a user writes information after the start of use of the product, a voltage corresponding to the high voltage VID is supplied from the product main body.

Before a description of the first embodiment, the configuration of the control circuit of the printing apparatus 1000 according to the first embodiment will be described below with reference to FIG. 9.

Figure 9:
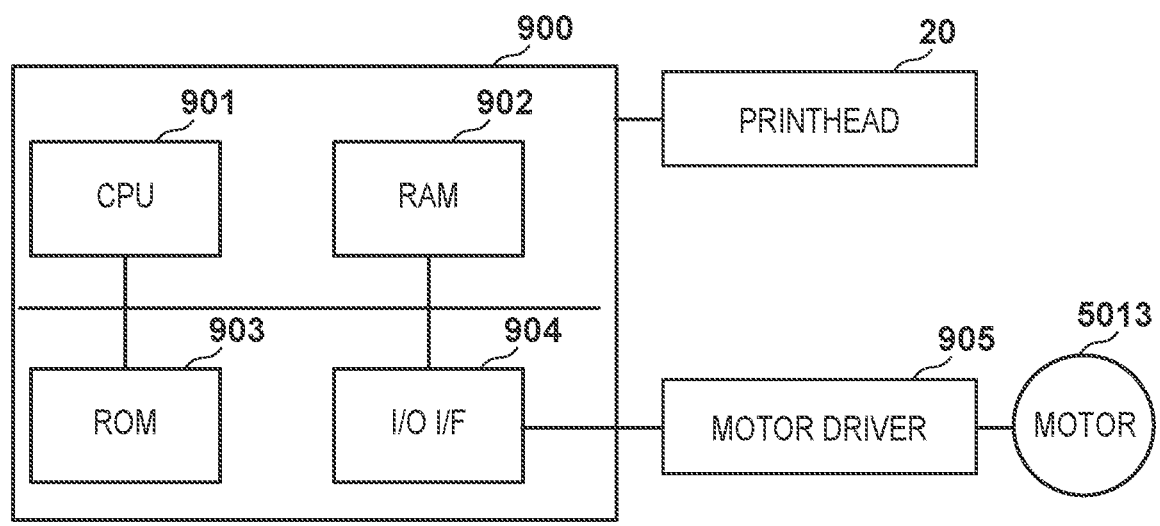
FIG. 9 is a block diagram for explaining the outline of a control configuration for controlling the printing apparatus according to the embodiment.

FIG. 9 is a block diagram for explaining the outline of a control configuration for controlling the printing apparatus 1000 according to the embodiment of the present invention.

A controller 900 controls the operation of the printing apparatus 1000. The controller 900 includes a CPU 901, a RAM 902, a ROM 903, and an input/output interface (I/O I/F) 904. The CPU 901 reads out a program stored in the ROM 903 and executes the program, thereby executing processing shown in a flowchart to be described later. Also, the CPU 901 controls various kinds of operations of the printing apparatus 1000 such as print processing. The input/output interface (I/O I/F) 904 is connected to a motor driver 905 that rotationally drives a conveyance motor 5013 described above. Note that the printing apparatus 1000 according to the embodiment further includes an operation panel, various kinds of sensors, a paper feeding unit, and the like, and there will be omitted here. Note that the functions of the units of the printing apparatus 1000 shown in FIG. 1 are implemented by the CPU 901 executing a program stored in the ROM 903.

An operation when driving the discharge module 204 will be described below with reference to FIGS. 1, 3A, and 4.

Figure 3A:
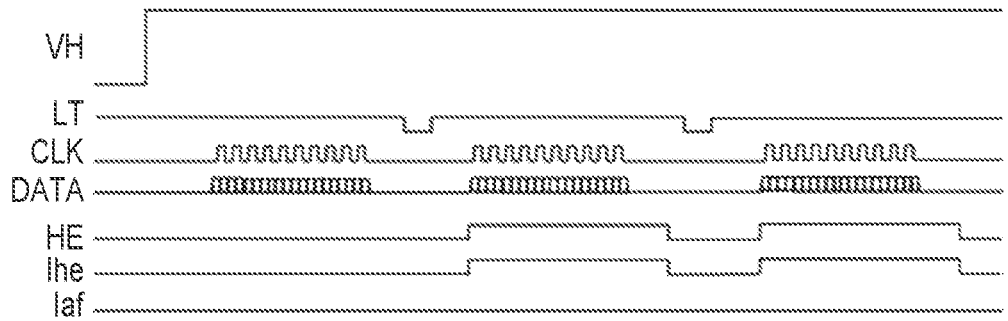
FIG. 3A is a timing chart for explaining signal input from the printing apparatus to the head substrate and an operation at the time of driving of the discharge module according to the first embodiment.

FIG. 3A is a timing chart for explaining signal input from the printing apparatus 1000 to the head substrate 11 and an operation at the time of diving of the discharge module 204 according to the first embodiment.

CLK, DATA, LT, and HE shown in FIG. 3A are signals input from the printing apparatus 1000 to a CLK terminal 230, a DATA terminal 231, an LT terminal 232, and an HE terminal 233 of the print element substrate 11 in FIG. 1, respectively. Ihe represents a current that flows to the discharge module 204, and Iaf represents a current that flows to the memory module 206. In FIG. 3A, serial data (DATA) used to select a print element is input to the shift register (S/R) 239 in synchronism with the CLK signal and latched by the plurality of stages of latch (LT) circuits 238 in accordance with the latch (LT) signal. When a driving signal is input from the HE terminal, the current Ihe flows to the selected print element Rh.

Figure 4:
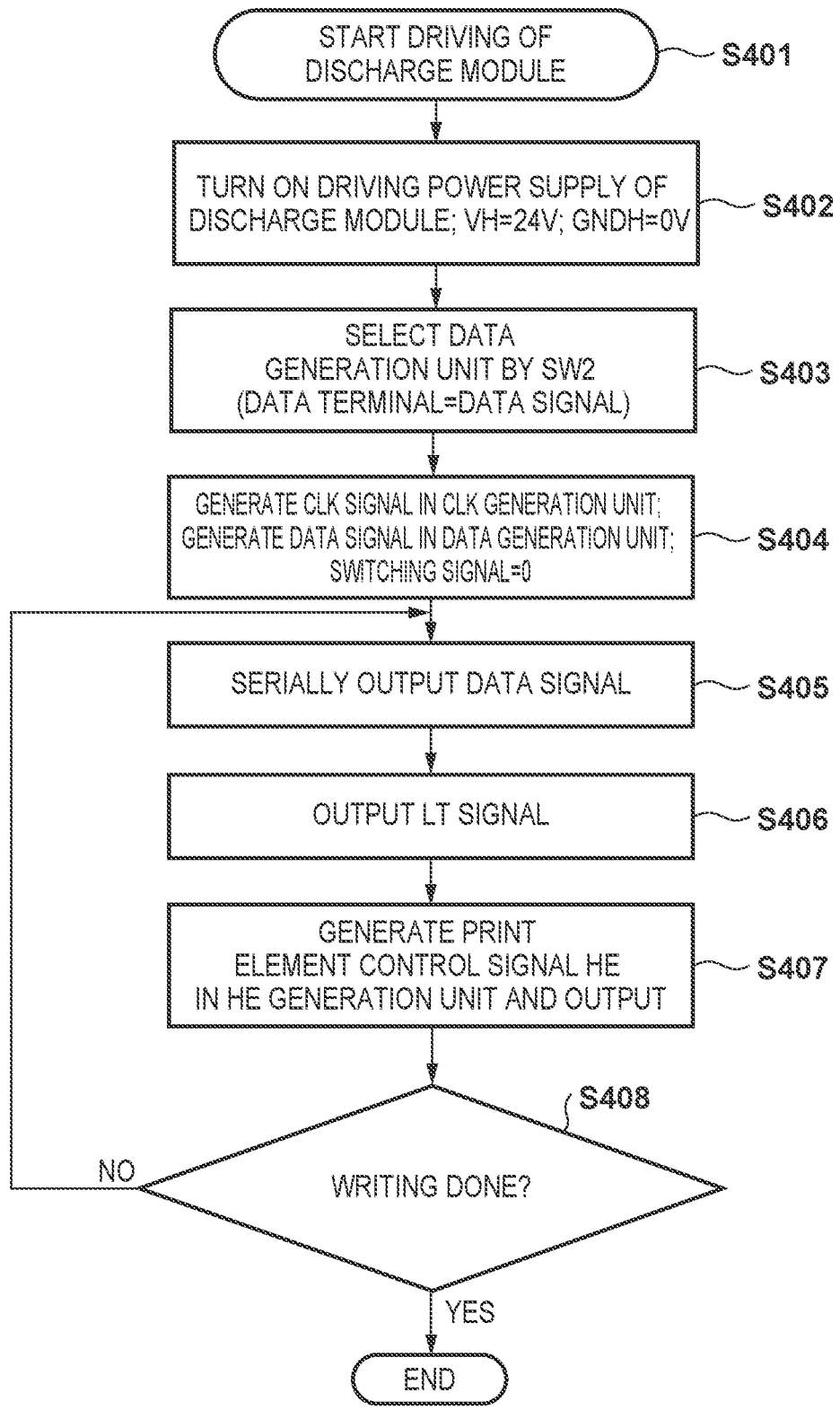
FIG. 4 is a flowchart for explaining processing when the printing apparatus according to the first embodiment drives the discharge module.

FIG. 4 is a flowchart for explaining processing when the printing apparatus 1000 according to the first embodiment drives the discharge module 204. Note that the processing shown in the flowchart is achieved by the CPU 901 executing a program stored in the ROM 903.

In step S401 of FIG. 4, the printing apparatus 1000 starts the driving operation of the discharge module 204. At this time, in step S402, the discharge module driving power supply circuit 229 is turned on before signal generation. Hence, the discharge module driving power supply voltage VH (for example, 24 V) is applied to the discharge module 204 via a VH terminal 235. At this time, a GNDH terminal 236 is set to 0 V. Note that step S402 may be executed at the same time as power-on of the printing apparatus 1000 independently of control by the CPU 901.

In the first embodiment, a switch SW2 is switched, thereby selectively connecting the outputs of a DATA generation unit 223 and the memory write pulse generation unit 226 to the DATA terminal 231. Hence, in step S403, the CPU 901 switches the switch SW2 to the side of the DATA generation unit 223. The DATA signal generated by the DATA generation unit 223 is thus input to the DATA terminal 231.

Next, the process advances to step S404, and the CPU 901 causes a CLK generation unit 222 to generate a CLK signal, and causes the DATA generation unit 223 to output, in synchronism with the CLK signal, a DATA signal used to selectively drive the discharge module 204. Here, the DATA signal is formed by 20 bits including 15 group bits, 4 group selection signal bits, and 1 bit of the switching signal 205, as shown in FIG. 3A. The group bits and the block selection bits are signals in which a bit corresponding to the discharge module 204 to be driven is "1". The switching signal 205 changes to low level when selecting and driving the discharge module 204.

At the time of driving of the discharge module 204, the switching signal 205 is supplied as low level. The discharge modules 204 and the memory modules 206 are exclusively driven by the switching signal 205, and all the print elements Rh and all the anti-fuse elements AF are not driven at the same time.

In step S405, the CPU 901 outputs the DATA signal in synchronism with the CLK signal input from the CLK terminal 230 and serially inputs it to the shift register (S/R) 239. When the 20-bit data is input to the shift register 239 in this way, the process advances to step S406. In step S406, the CPU 901 supplies, from the LT terminal 232, a latch (LT) signal generated by an LT generation unit 224. Hence, the 20-bit data signal is held by the latch circuit 238. The thus input serial signal is converted into a parallel signal. At this time, some data signal bits of the 20-bit data are output as the block selection signal 203 via the decoder 237.

In the first embodiment, 4-bit data for selecting a block of discharge modules 204 is decoded into a 16-bit block selection signal 203 by the decoder 237 and output. In addition, the control data supply circuit 201 outputs the switching signal 205 in accordance with the value of one switching bit included in the 20-bit data signal.

At this time, the switch SW3 that controls connection between the memory control signal 221 and the DATA terminal 231 is turned off by the switching signal 205 of low level supplied from the control data supply circuit 201.

Hence, the memory control signal 221 to be input to the memory module 206 is set in an open state, and the memory control signal ME 221 is not input to the memory module 206.

The process advances to step S407, and the CPU 901 inputs, from the HE terminal 233, an HE (Heat Enable) signal that is a print element control signal generated by an HE generation unit 225. Hence, the corresponding group selection signal 202, block selection signal 203, switching signal 205, and print element control signal HE 220 are input to the AND circuit AND1 for the selected print element. Accordingly, the driving element MD1 of the selected discharge module 204 is set in a conductive state in response to the control signal HE 220, the print element Rh connected in series with the driving element MD1 is energized and driven, and the current Ihe flows to the discharge module. The process advances to step S408, and the CPU 901 determines whether, for example, printing of one line is ended. If printing is not ended, the process returns to step S405 to execute the above-described processing. If printing of one line is not ended, the processing is ended.

Note that in FIG. 3A, in parallel to the driving of the discharge module 204, the CLK signal and the DATA signal are supplied for the next print processing. With this, a signal for selecting the discharge module 204 to be driven in the next column is input to the shift register 239. When the print element control signal HE 220 is input to end the driving of the discharge module 204 in this way, and the LT signal is input after that, the signal for selecting the discharge module 204 to be driven in the next column is latched by the latch circuit 238. When the HE signal supplied from the control data supply circuit 201 is input again, the operation of driving the selected print element Rh and making the current Ihe flow to the selected discharge module 204 is repeated.

An operation when driving the memory module 206 will be described next with reference to FIGS. 1, 3B, and 5.

Figure 3B:
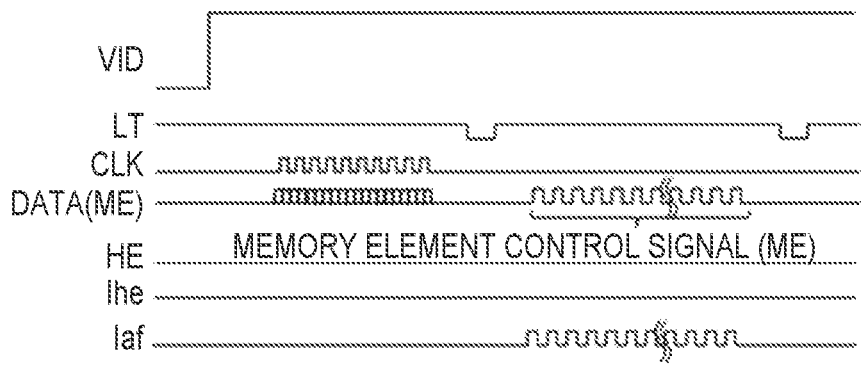
FIG. 3B is a timing chart for explaining signal input from the printing apparatus to the head substrate and an operation at the time of write to the memory module according to the first embodiment.

FIG. 3B is a timing chart for explaining signal input from the printing apparatus 1000 to the head substrate 11 and an operation at the time of write to the memory module 206 according to the first embodiment.

Figure 5:
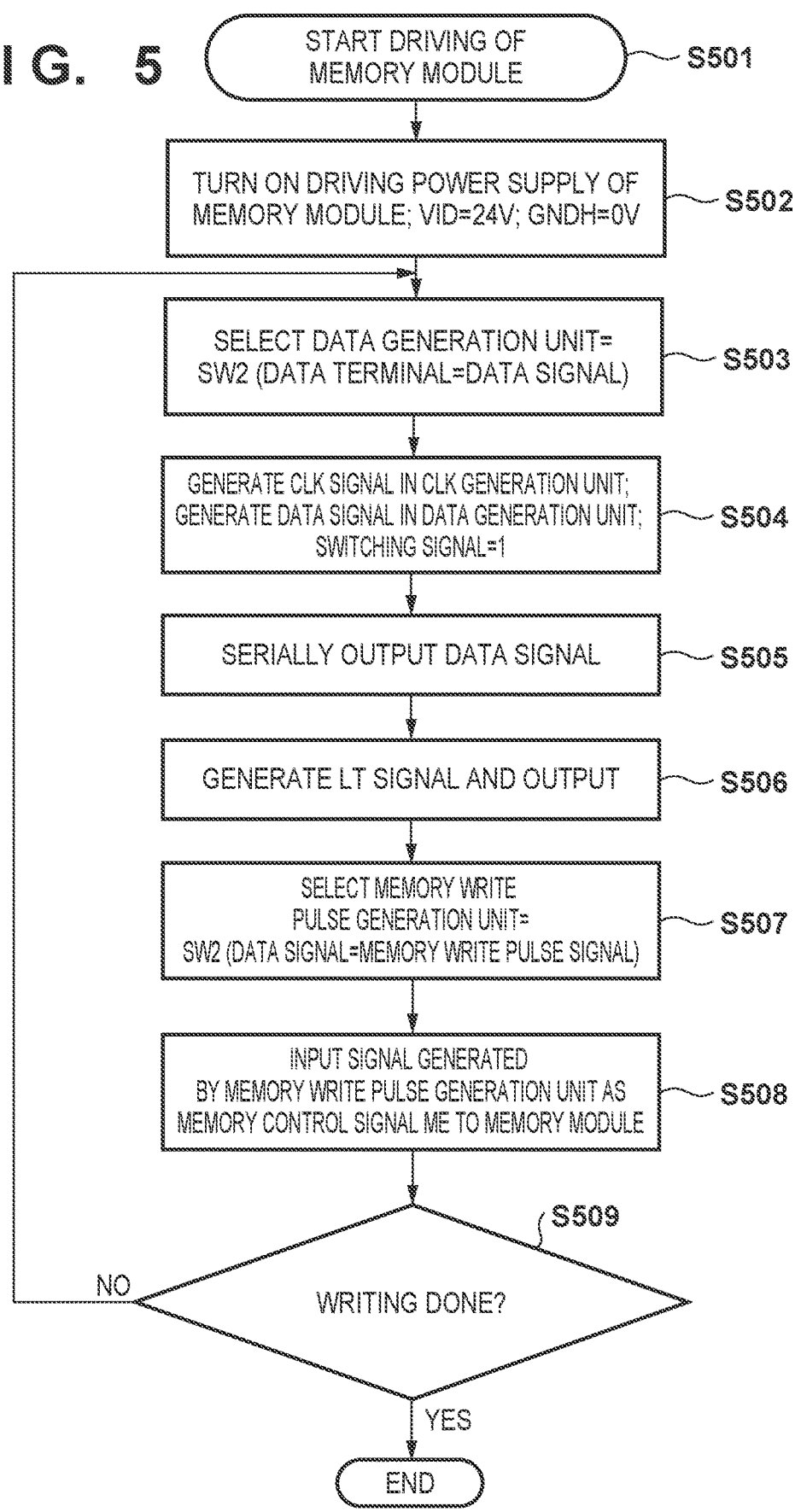
FIG. 5 is a flowchart for explaining write processing to the memory module by the printing apparatus according to the first embodiment.

FIG. 5 is a flowchart for explaining write processing to the memory module 206 by the printing apparatus 1000 according to the first embodiment. Note that the processing shown in the flowchart is achieved by the CPU 901 executing a program stored in the ROM 903.

First, in step S501, the printing apparatus 1000 starts the write operation to the memory module 206. Next, the process advances to step S502, the CPU 901 turns on the memory write power supply circuit 228 before signal generation, and the memory write power supply voltage VID (for example, 24 V) is applied to the memory module 206 via a VID terminal 234. Here, the GNDH terminal 236 is set to 0 V. Note that step S502 may be executed at the same time as power-on of the printing apparatus 1000 independently of control by the CPU 901.

Next, the process advances to step S503, and the CPU 901 connects the switch SW2 to the side of the DATA generation unit 223 to input a generated DATA signal to the DATA terminal 231. Next, the process advances to step S504, and the CPU 901 causes the CLK generation unit 222 to generate a CLK signal, causes the DATA generation unit 223 to generate a DATA signal, and sets the switching signal 205 to high level. In step S505, the CPU 901 outputs the DATA signal for driving the memory module 206, which is generated by the DATA generation unit 223, in synchronism with the CLK signal. Here, the DATA signal is formed by 20 bits including 15 block selection bits, 4 block selection bits, and 1 bit of the switching signal 205, as shown in FIG. 3B. The configuration of the transmission bits is the same as in the driving of the discharge module 204. In the group selection bits and the block selection bits, a bit corresponding to the memory module 206 to write changes to high level. At this time, the switching signal 205 is at high level because of write to the memory module 206.

Here, although the switching signal 205 is supplied at high level at the time of write to the memory module 206, since the discharge modules 204 and the memory modules 206 are exclusively driven by the switching signal 205, all the print elements Rh and all the anti-fuse elements AF are not driven at the same time.

The process advances to step S506, and the CPU 901 outputs an LT signal generated by the LT generation unit 224 via the LT terminal 232. Accordingly, the 20-bit data signal is latched by the latch circuit 238, and the input serial signal is converted into a parallel signal. At this time, some data signal bits pass through the decoder 237, and the group selection signal 202 and the block selection signal 203 are supplied from the control data supply circuit 201.

Here, 4 block selection bits of the memory module 206 are converted into the 16-bit block selection signal 203 by the decoder 237 and supplied. In addition, since the switching signal 205 is at high level, the switch SW3 that controls connection between the memory control signal and the DATA terminal 231 is turned on. In this way, the memory control signal ME and the DATA terminal 231 are connected.

Next, in step S507, the CPU 901 switches the switch SW2 to the side of the memory write pulse generation unit 226. The memory write pulse generation unit 226 is thus connected to the DATA terminal 231. When the output of the memory write pulse generation unit 226 is connected to the memory control signal ME to be input to the memory module 206 in this way, the process advances to step S508. In step S508, the CPU 901 causes the memory write pulse generation unit 226 to generate a memory write pulse signal, and inputs the pulse signal as the memory control signal ME to the memory module 206 via the DATA terminal 231.

Accordingly, the corresponding group selection signal 202, block selection signal 203, switching signal 205, and memory element control signal ME are input to the AND circuit AND2 for memory element selection. The driving element MD2 for the selected memory element is set in a pulse-driven state in response to the input memory element control signal ME. Hence, the current Iaf flows to the anti-fuse element AF connected in series with the driving element MD2 for memory element.

In step S509, it is determined whether the write is ended. If the write is not ended, that is, if write to another memory module 206 is to be performed, the process returns to step S503 to repeat the above-described series of operations. The above-described driving operation of the discharge module 204 can also be performed.

Here, as described above, as the write principle of the anti-fuse memory, a voltage is applied to the gate oxide film that forms the anti-fuse element AF, and the gate oxide film is broken, thereby writing information to the anti-fuse element AF. On the other hand, in an element like a Poly fuse memory to which write is performed by disconnecting a resistive element, the write is performed by applying a DC voltage for a predetermined time. In the anti-fuse element AF, however, the write cannot be performed using a DC voltage.

In the anti-fuse memory, burst driving that intermittently applies a voltage having a pulse waveform like DATA (memory element control signal ME) shown in FIG. 3B is performed. The gate oxide film of the anti-fuse element AF is thus broken, and information is written to the memory module 206. As the memory element control signal ME, a pulse waveform having an arbitrary frequency and an arbitrary number of pulses is generated by the memory write pulse generation unit 226 of the printing apparatus 1000 and used.

In the first embodiment, the memory write pulse generation unit 226 generates a rectangular wave having a frequency of 5 MHz and 100,000 pulses and outputs the rectangular wave as the memory element control signal ME to the memory module 206, thereby performing write.

Note that in the first embodiment, as shown in FIG. 3B, when write to the memory module 206 is being performed, the CLK signal is not output, unlike in the driving of the discharge module 204 shown in FIG. 3A. A circuit configuration (not shown) for preventing write to the memory module 206 even if the CLK signal is output is thus formed. This is because when driving the discharge module 204, the group selection signal 202 and the block selection signal 203 are used, as in the write to the memory module 206. Even if the switching signal 205 is inverted by noise or the like, and an operation error occurs, an erroneous write to the memory module 206 is prevented.

As described above, according to the first embodiment, when writing data to the anti-fuse memory element, a memory write pulse is given as a memory control signal via the switch SW3, thereby writing data to the memory element without increasing the number of terminals of the element substrate.

Second Embodiment

Figure 6:
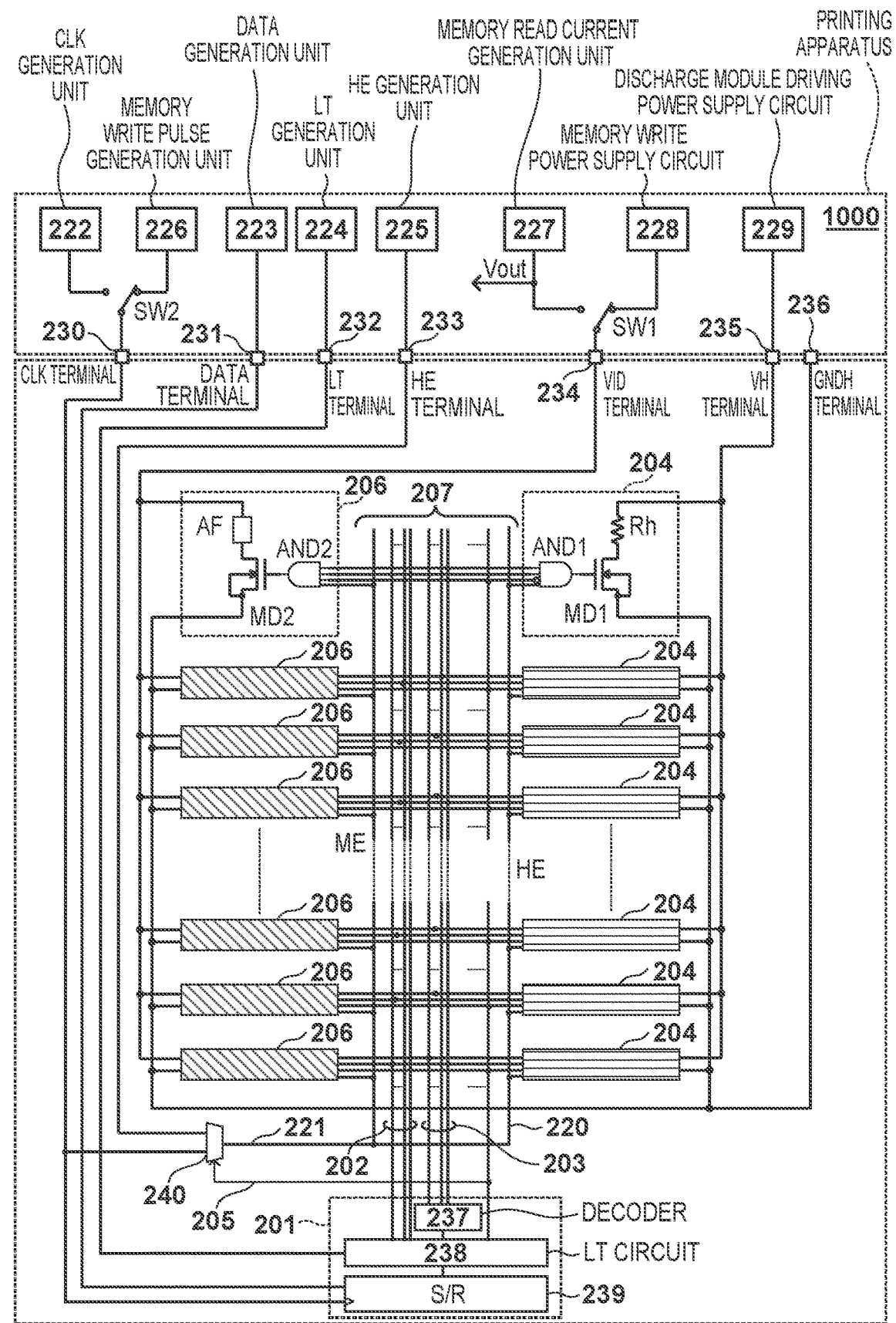
FIG. 6 is a view showing discharge modules, memory modules, and a part of a driving circuit configuration mounted on an element substrate 11a according to the second embodiment.

FIG. 6 is a view showing discharge modules 204, memory modules 206, and a part of a driving circuit configuration mounted on an element substrate 11 a (to be also simply referred to as a "substrate" hereinafter) according to the second embodiment. Note that the same reference numerals as in the above-described element substrate 11 shown in FIG. 1 denote the same parts in FIG. 6, and a description thereof will be omitted.

The element substrate 11a is different from the above-described print element substrate 11 according to the first embodiment shown in FIG. 1 in two points. One point is that a CLK generation unit 222 and a memory write pulse generation unit 226 can selectively be connected to a CLK terminal 230 by switching a switch SW2. The other point is that a memory control signal ME 221 and a print element control signal HE 220 are selectively supplied by a multiplexer 240 to the memory module 206 and the discharge module 204 via a common wiring. Here, if a switching signal 205 is at low level, the multiplexer 240 selects an HE (Heat Enable) signal input from an HE terminal 233 and outputs it as the HE signal 220. On the other hand, if the switching signal 205 is at high level, the multiplexer 240 selects a CLK signal input from the CLK terminal 230 and outputs it as the memory control signal ME 221. In the circuit shown in FIG. 6, the switching signal 205 is input to an AND circuit AND1 of the discharge module 204 and an AND circuit AND2 of the memory module 206. If the switching signal 205 is at low level, the AND circuit AND1 can output a high-level signal. If the switching signal 205 is at high level, the AND circuit AND2 can output a high-level signal. Hence, the discharge module 204 and the memory module 206 are never driven simultaneously by the print element control signal HE 220.

An operation when driving the discharge module 204 will be described below with reference to FIGS. 6, 3A, and 7. Note that the timing chart when driving the discharge module 204 according to the second embodiment is the same as FIG. 3A of the above-described first embodiment, and a description thereof will be omitted.

Figure 7:
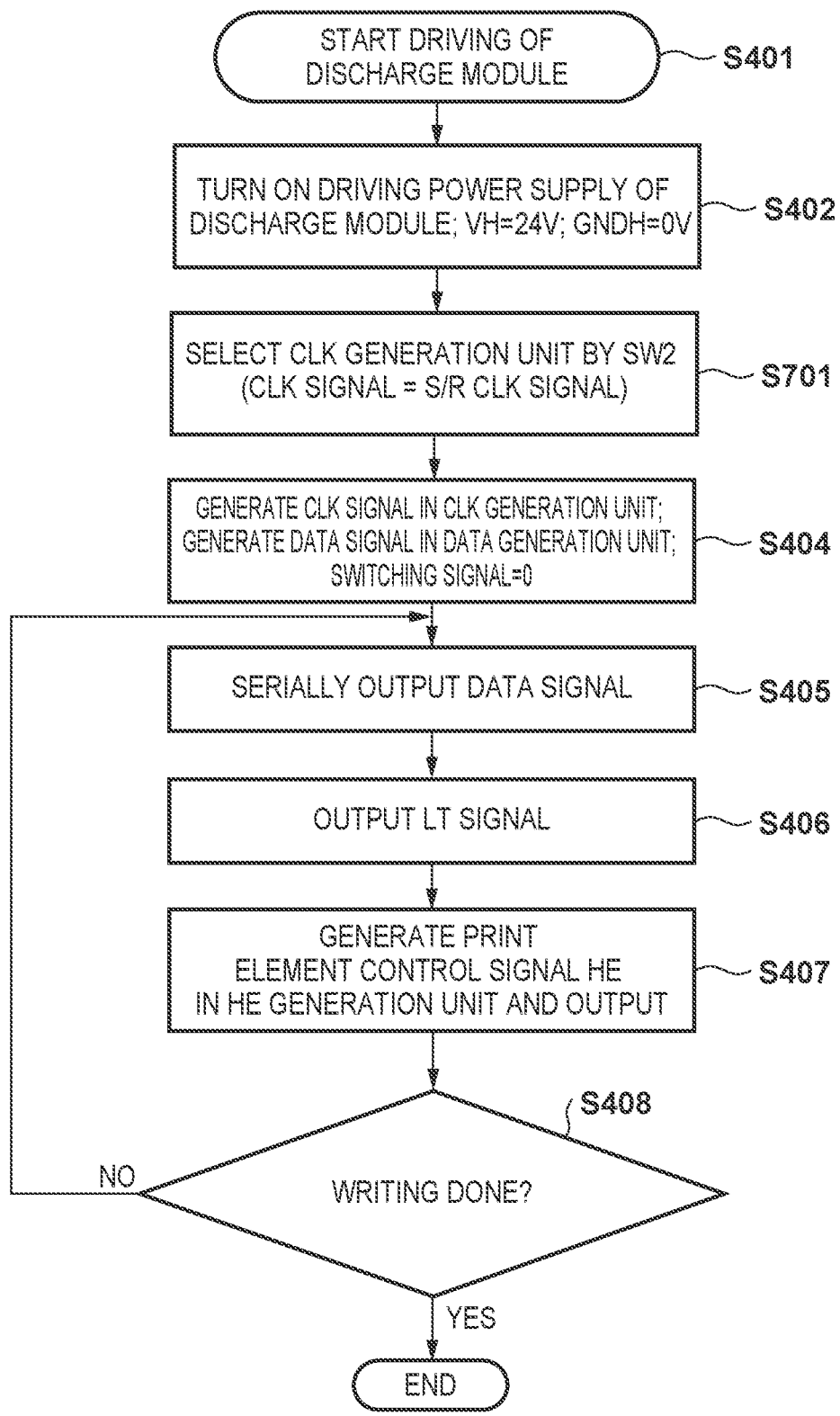
FIG. 7 is a flowchart for explaining processing when a printing apparatus according to the second embodiment drives the discharge module.

FIG. 7 is a flowchart for explaining processing when a printing apparatus 1000 according to the second embodiment drives the discharge module 204. Note that the processing shown in the flowchart is achieved by a CPU 901 executing a program stored in a ROM 903. Note that the same step numbers as in FIG. 4 described above denote the same processes in FIG. 7. However, even if the processing is the same, the operation of the circuit shown in FIG. 6 is different from the above-described first embodiment, and the different points will be described in detail.

As described above, in the print element substrate 11a according to second embodiment, the CLK generation unit 222 and the memory write pulse generation unit 226 can selectively be connected to the CLK terminal 230 by switching the switch SW2.

For this reason, in step S701, a CPU 901 switches the switch SW2 to the side of the CLK generation unit 222. This obtains a state in which a CLK signal generated by the CLK generation unit 222 is input to the CLK terminal 230. The process advances to step S404, and the CPU 901 causes the CLK generation unit 222 to generate the CLK signal, and causes a DATA generation unit 223 to output, in synchronism with the CLK signal, a DATA signal used to selectively drive the discharge module 204. Here, the DATA signal is formed by 20 bits including 15 group bits, 4 group selection signal bits, and 1 bit of the switching signal 205, as shown in FIG. 3A. The group bits and the block selection bits are signals in which a bit corresponding to the discharge module 204 to be driven is "1". The switching signal 205 changes to low level when selecting and driving the discharge module 204. Accordingly, the multiplexer 240 selects the HE (Heat Enable) signal input from the HE terminal 233.

In step S405, the CPU 901 outputs the DATA signal in synchronism with the CLK signal input from the CLK terminal 230 and serially outputs it to a shift register (S/R) 239. When the 20-bit data is input to the shift register 239 in this way, the process advances to step S406. In step S406, the CPU 901 supplies, from an LT terminal 232, an LT signal generated by an LT generation unit 224. Hence, the 20-bit data signal is held by an LT circuit 238. The thus input serial signal is converted into a parallel signal. At this time, some data signal bits of the 20-bit data are output as a block selection signal 203 via a decoder 237.

In step S407, the HE (Heat Enable) signal that is a print element control signal generated by an HE generation unit 225 is supplied from the HE terminal 233. At this time, as described above, the multiplexer 240 selects the input of the HE terminal 233 in accordance with the switching signal 205 and outputs it to the common wiring for the memory control signal ME 221 and the print element control signal HE 220. Hence, a corresponding group selection signal 202, block selection signal 203, switching signal 205, and print element control signal HE 220 are input to the AND circuit AND1 for the selected print element. Accordingly, the driving element MD1 of the selected discharge module is set in a conductive state in response to the control signal HE 220, a print element Rh connected in series with the driving element MD1 is energized and driven, and a current Ihe flows to the discharge module.

The discharge module 204 can be driven to perform printing in the above-described way.

An operation when driving the memory module 206 according to the second embodiment will be described next with reference to FIGS. 6, 3C, and 8.

Figure 3C:
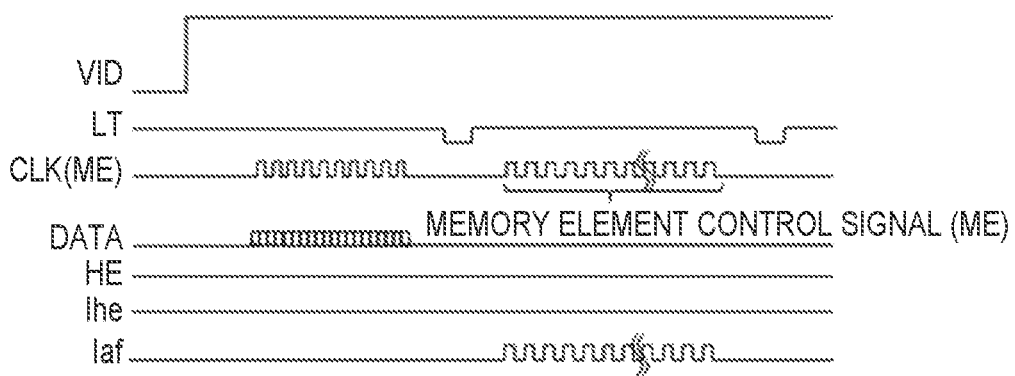
FIG. 3C is a timing chart for explaining signal input from a printing apparatus to a head substrate and an operation at the time of write to a memory module according to the second embodiment.

FIG. 3C is a timing chart for explaining signal input from the printing apparatus 1000 to the head substrate 11 a and an operation at the time of write to the memory module 206 according to the second embodiment.

Figure 8:
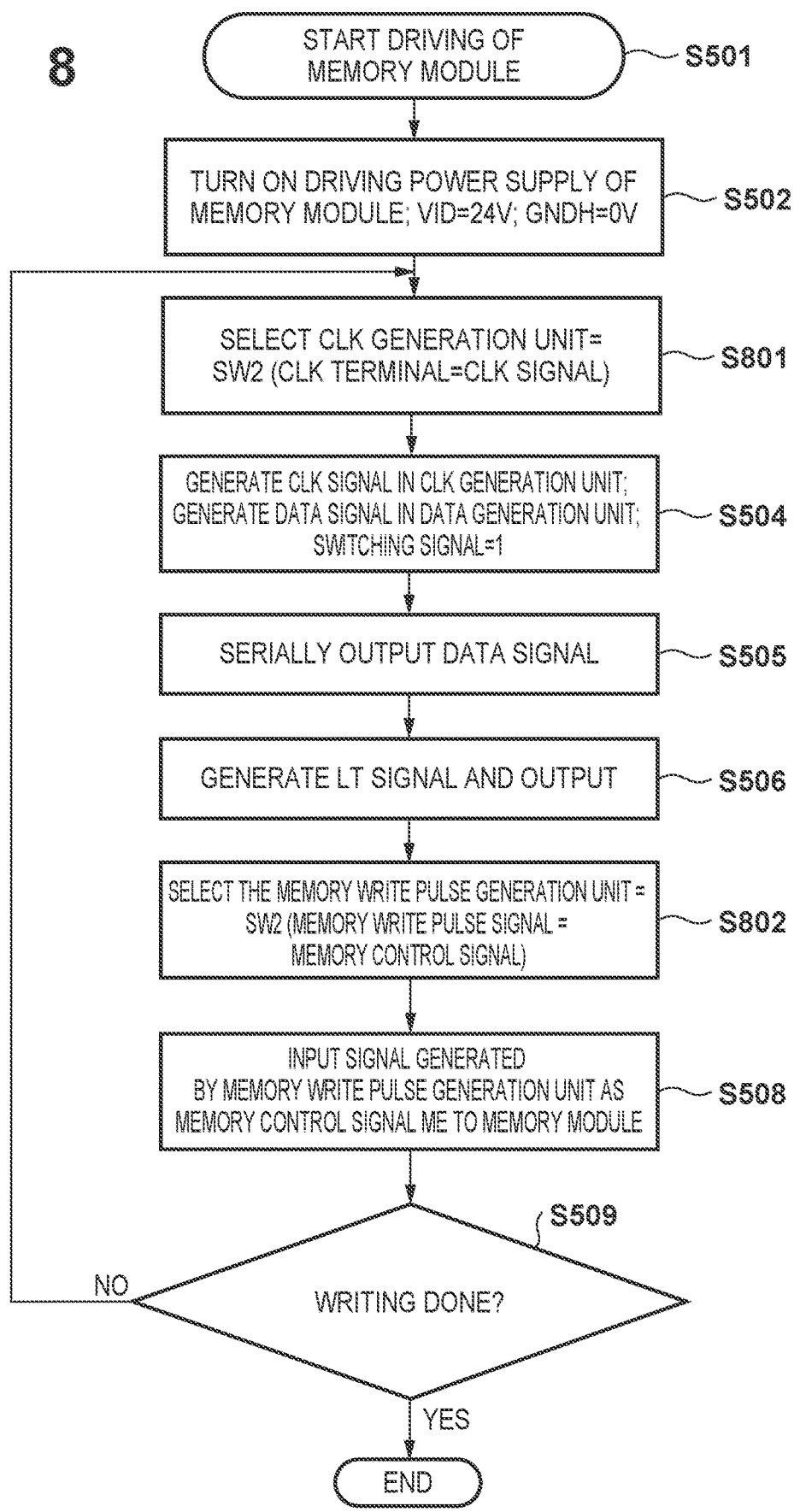
FIG. 8 is a flowchart for explaining write processing to the memory module by the printing apparatus according to the second embodiment.

FIG. 8 is a flowchart for explaining write processing to the memory module 206 by the printing apparatus 1000 according to the second embodiment. Note that the processing shown in the flowchart is achieved by the CPU 901 executing a program stored in the ROM 903. Note that the same step numbers as in FIG. 5 of the first embodiment described above denote the same processes in FIG. 8. However, even if the processing is the same, the operation of the circuit shown in FIG. 6 is different from the above-described first embodiment, and the different points will be described in detail.

In step S801, the CPU 901 switches the switch SW2 to the side of the CLK generation unit 222. Hence, the CLK signal is input to the CLK terminal 230. The process advances to step S504, and the CPU 901 causes the CLK generation unit 222 to generate the CLK signal. In step S505, the CPU 901 outputs the DATA signal for driving the memory module 206, which is generated by the DATA generation unit 223, in synchronism with the CLK signal. At this time, the switching signal 205 changes to high level because write to the memory module 206 is selected. Here, although the switching signal 205 is supplied at high level at the time of write to the memory module 206, since the discharge modules 204 and the memory modules 206 are exclusively driven by the switching signal 205, all the print elements Rh and all anti-fuse elements AF are not driven at the same time.

The process advances to step S506, and the CPU 901 outputs the LT signal generated by the LT generation unit 224 via the LT terminal 232. At this time, some data signal bits pass through the decoder 237, and the group selection signal 202 and the block selection signal 203 are supplied from a control data supply circuit 201.

The process advances to step S802, and the CPU 901 switches the switch SW2 to the side of the memory write pulse generation unit 226. This obtains a state in which a pulse signal generated by the memory write pulse generation unit 226 is input to the CLK terminal 230. Here, since the switching signal 205 is at high level at the time of write to the memory module 206, the multiplexer 240 selects the input from the CLK terminal 230. Hence, the pulse signal generated by the memory write pulse generation unit 226 is supplied as the memory control signal ME 221. In this way, in step S508, the driving element MD1 for the selected memory element is set in an ON state in response to the input memory element control signal ME 221, and a current Iaf flows to the anti-fuse element AF connected in series with the driving element MD2 for memory element, thereby performing write to the memory element.

Hence, as shown in FIG. 3C, at the time of write to the memory element, the pulse signal generated by the memory write pulse generation unit 226 is supplied as the memory control signal ME 221. It is therefore possible to perform write to the memory element by applying, a plurality of times, a pulse waveform that intermittently applies a voltage to the anti-fuse element AF.

Note that as shown in FIG. 3C, when write to the memory module 206 is being performed, the DATA signal is not input, unlike in the driving of the discharge module 204. A circuit configuration (not shown) for preventing write to the memory module 206 even if the DATA signal is input is thus formed. This is because when driving the discharge module 204, the group selection signal 202, the block selection signal 203, and the print element control signal HE 220 are commonly used, and even if the switching signal 205 causes data inversion by noise or the like, and an operation error occurs, an erroneous write to the memory module 206 is prevented.

As described above, according to the second embodiment, when writing data to the anti-fuse element AF, the write is performed by supplying the pulse signal generated by the memory write pulse generation unit 226, thereby implementing data write to the memory element. In addition, since the pulse signal uses a terminal common to the CLK signal, an increase in the number of terminals of the substrate can be suppressed.

Third Embodiment

Figure 10:
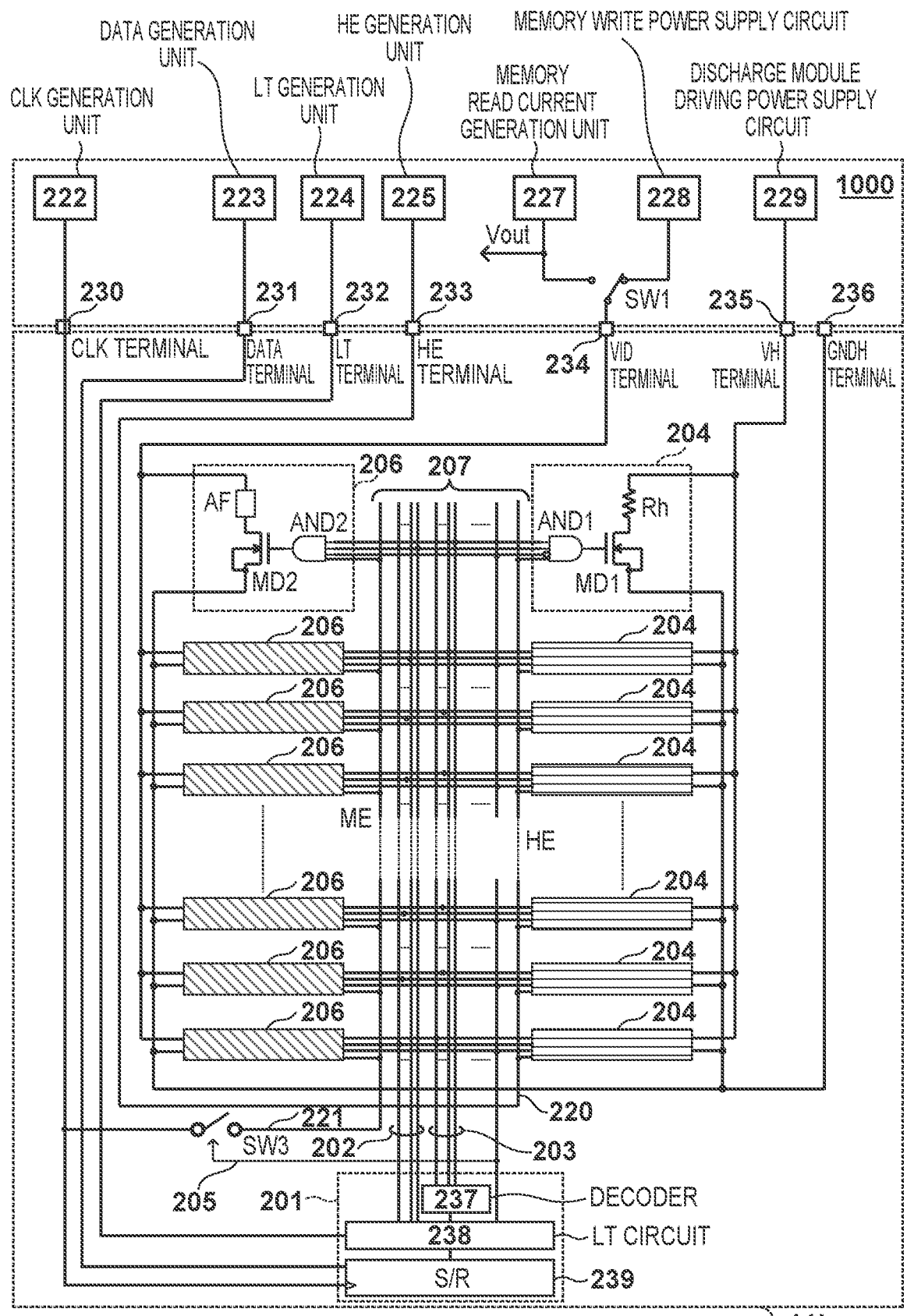
FIG. 10 is a view showing discharge modules, memory modules, and a part of a driving circuit configuration mounted on an element substrate 11b according to the third embodiment.

FIG. 10 is a view showing discharge modules 204, memory modules 206, and a part of a driving circuit configuration mounted on an element substrate 11b (to be also simply referred to as a "substrate" hereinafter) according to the third embodiment. Note that the same reference numerals as in the above-described element substrate 11 shown in FIG. 1 denote the same parts in FIG. 10.

The third embodiment is different from the first embodiment in two points. One point is that a memory write pulse generation unit 226 capable of generating a pulse waveform pulse waveform having an arbitrary frequency and an arbitrary number of pulses and a switch SW2 are not provided. The other point is that a CLK signal supplied to a CLK terminal 230 is used as a memory control signal ME 221. In addition, at the time of write to the memory module 206, a signal having a CLK frequency and the number of pulses to be transmitted at the time of write to the memory module 206 is repeated, thereby performing write to the memory module 206.

Figure 3D:
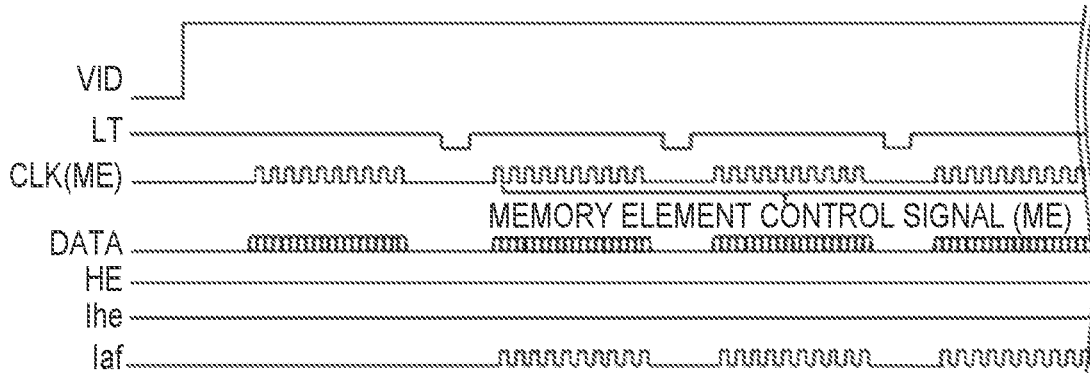
FIG. 3D is a timing chart for explaining signal input from a printing apparatus to a head substrate and an operation at the time of write to a memory module according to the third embodiment.

FIG. 3D is a timing chart for explaining signal input from a printing apparatus 1000 to the head substrate and an operation at the time of write to the memory module 206 according to the third embodiment.

Figure 11:
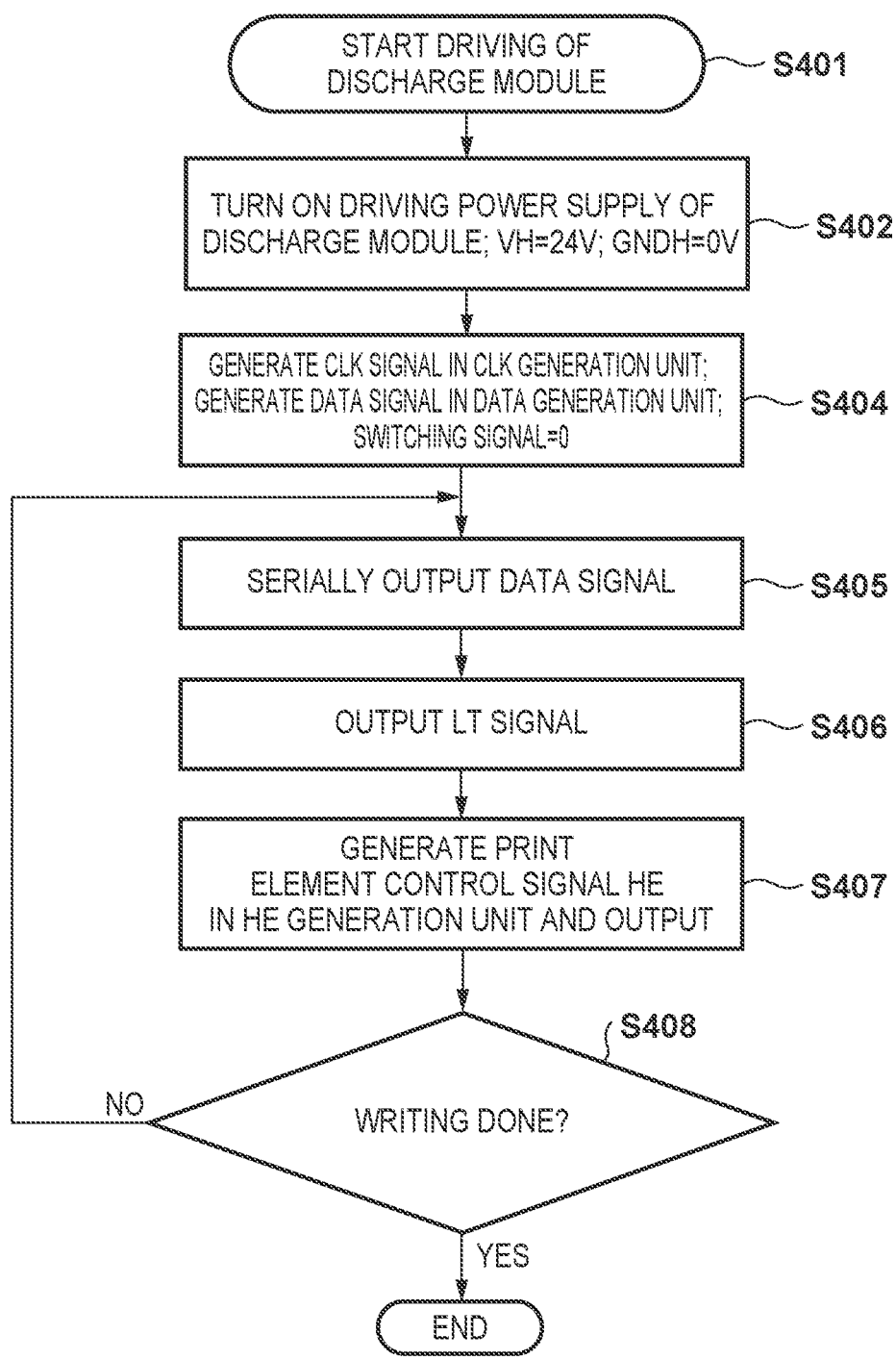
FIG. 11 is a flowchart for explaining processing when a printing apparatus according to the third embodiment drives the discharge module.

FIG. 11 is a flowchart for explaining processing when the printing apparatus 1000 according to the third embodiment drives the discharge module 204. Note that the processing shown in the flowchart is achieved by a CPU 901 executing a program stored in a ROM 903. Note that the same step numbers as in FIG. 4 described above denote the same processes in FIG. 11. The only difference from the flowchart shown in FIG. 4 of the first embodiment is the deletion of S402 in FIG. 4. The rest of the operation is the same as in the first embodiment. Also, an operation when driving the discharge module according to the third embodiment is shown in FIG. 3A, as in the first embodiment.

In the third embodiment, since the memory write pulse generation unit 226 and the switch SW2 are not provided, as described above, the operation of controlling the switch SW2, which is performed in step S402 of FIG. 4, need not be performed.

An operation when driving the memory module 206 according to the third embodiment will be described next with reference to FIGS. 10, 3D, and 12.

Figure 12:
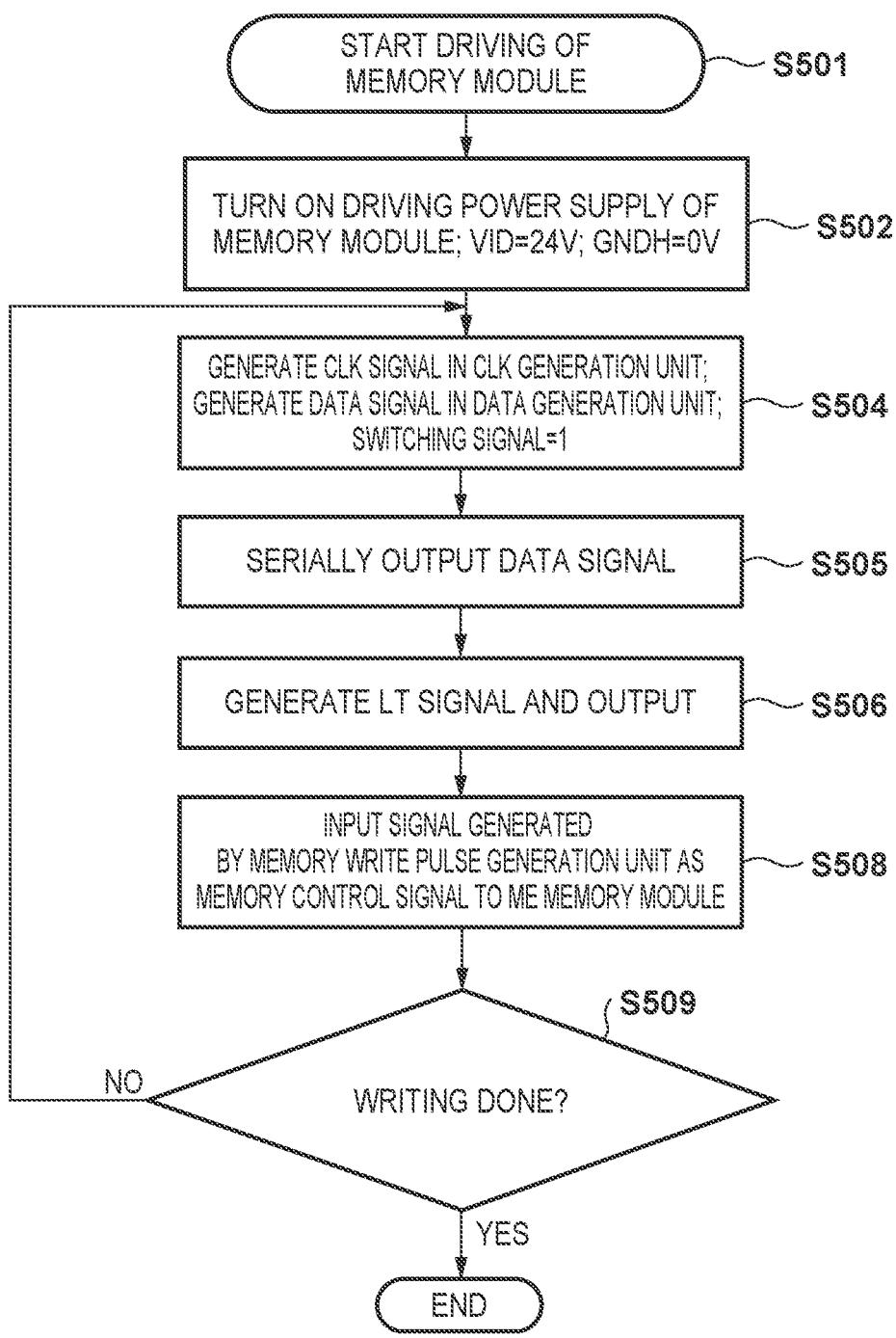
FIG. 12 is a flowchart for explaining write processing to the memory module by the printing apparatus according to the third embodiment.

FIG. 12 is a flowchart for explaining write processing to the memory module 206 by the printing apparatus 1000 according to the third embodiment. Note that the same step numbers as in the flowchart of FIG. 5 according to the first embodiment described above denote the same processes in the flowchart of FIG. 13, and a description thereof will be omitted.

In the third embodiment, since the memory write pulse generation unit 226 and the switch SW2 are not provided, as described above, the operation of controlling the switch SW2, which is performed in steps S503 and S507 of FIG. 5, need not be performed.

Referring to FIG. 12, in step S504, a switching signal 205 is changed to high level, thereby turning on a switch SW3. Accordingly, in step S508, a CLK signal generated by a CLK generation unit 222 is input as a memory control signal ME 221 to the memory module 206 via a CLK terminal 230. Accordingly, a corresponding group selection signal 202, block selection signal 203, switching signal 205, and memory element control signal ME 221 are input to an AND circuit AND2 for memory element selection. A driving element MD1 for the selected memory element is set in an ON state in response to the input memory element control signal ME, and a current Iaf flows to an anti-fuse element AF connected in series with a driving element MD2 for memory element.

Here, as described above, in the anti-fuse memory, burst driving that intermittently applies a voltage having a pulse waveform is performed, thereby breaking the gate oxide film of the anti-fuse element and writing information to the memory module 206.

In the third embodiment, since the CLK signal has 10 pulses (a frequency of 8 MHz) in data transmission of one column, as shown in FIG. 3D, data transmission of 10,000 columns is repeated, thereby applying 100,000 rectangular wave pulses, as in the above-described first embodiment. Note that since the conditions of pulses to be applied change depending on conditions such as the applied voltage and the structure of the memory element AF, optimum pulse conditions are preferably set in accordance with the printing apparatus 1000 or the print elements.

Also, in the third embodiment, the CLK terminal 230 and a DATA terminal 231 are used only by the CLK signal and the DATA signal, as shown on the substrate in FIG. 10. For this reason, as in the driving of the discharge module 204, the DATA signal for the write of the next column can be transmitted in parallel to the write to the memory module 206 (unlike the above-described first and second embodiments). Hence, when the element substrate 11b receives an LT signal next, the memory module 206 to which data is to be written in the next column is selected. Every time the LT signal is output, write to the memory element and transmission of selection data can be performed in parallel. Accordingly, if data is repetitively transmitted, write to the memory module 206 can be performed in a shorter time.

In the third embodiment, since the memory write pulse generation unit 226 and the switch SW2 are not provided, the circuit configuration and the operation of the printing apparatus 1000 can be simplified as compared to the first and second embodiments.

In the first to third embodiments, examples in which the configuration of the print element substrate is partially changed have been described. The changed portions may be combined to constitute various forms in each embodiment. For example, the first and third embodiments may employ the configuration according to the second embodiment, in which the memory control signal ME 221 and the print element control signal HE 220 are selectively supplied, by the multiplexer 240, to the memory module 206 and the discharge module 204 via a common wiring.

Alternatively, the second embodiment may employ the configuration in which the DATA generation unit 223 and the memory write pulse generation unit 226 can selectively be connected to the CLK terminal 230 by switching the switch SW2. Also, in the third embodiment, the DATA signal supplied to the DATA terminal 231 may be used as the memory control signal ME 221.

Note that at the time of driving of the discharge module 204 and at the time of write to the memory module 206, it is preferable that the memory control signal ME 221 is not used as the print element control signal HE 220 such that an operation error or erroneous write does not occur even if the switching signal 205 is inverted by noise or the like.

As described above, according to the third embodiment, the control signal for anti-fuse memory write also serves as a data signal and a clock signal. Hence, the clock signal and the data signal transmitted in synchronism with the clock signal can generally be transmitted at a high frequency. Hence, even if a high-frequency signal is transmitted, reliable data write can be performed in a short time without any problem.

In addition, since the control signal for write to the anti-fuse memory element is not provided independently, the number of terminals can be decreased, and therefore, an effect of suppressing an increase in the size of the element substrate can be obtained.

As described above, according to the embodiment, no problem is posed even if a high-frequency signal is transmitted as the clock signal and the data signal transmitted in synchronism with the clock signal. Hence, when the data signal or the clock signal is used as the control signal for write to the anti-fuse memory, reliable data write can be performed in a shorter time.

In addition, since the control signal for write to the anti-fuse memory is not provided independently, an increase in the number of terminals can be prevented, and therefore, an effect of suppressing an increase in the size of the print element substrate can be obtained.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-040698, filed Mar. 12, 2021, which is hereby incorporated by reference herein in its entirety.

What is claimed is:

1. An element substrate comprising:
a plurality of groups of print elements;
a plurality of groups of memory elements;
a first terminal to which a clock signal is input;
a second terminal to which a data signal is input;
a third terminal to which a driving signal for driving the print element is input;
a control data supply unit configured to receive the data signal input from the second terminal in synchronism with the clock signal input from the first terminal and output a selection signal used to select groups and blocks of the memory elements and the print elements; and
a selection unit configured to perform selection, in accordance with a switching signal included in the data signal, to connect one of the clock signal input from the first terminal and the driving signal input from the third terminal to a print element control signal for controlling driving of the print element and a memory control signal for controlling the memory element,
wherein in driving of the print element, the switching signal switches such that the selection unit selects the driving signal input from the third terminal, and in driving of the memory element, the switching signal switches such that the selection unit selects the clock signal input from the first terminal, and a pulse signal for the write to the memory element is input via the first terminal.

2. An element substrate comprising:
a plurality of groups of print elements;
a plurality of groups of memory elements;
a first terminal to which a clock signal is input;
a second terminal to which a data signal is input;
a control data supply unit configured to receive the data signal input from the second terminal in synchronism with the clock signal input from the first terminal and output a selection signal used to select groups and blocks of the memory elements and the print elements; and
a switch configured to switch connection between the first terminal and a memory control signal of the memory element in accordance with a switching signal included in the data signal,
wherein in write to the memory element, the switching signal switches such that the switch connects the first terminal and the memory control signal of the memory element, and a pulse signal for the write to the memory element is input via the first terminal.

* * * * *